(12) United States Patent
Vaiyapuri

(10) Patent No.: US 6,844,217 B2
(45) Date of Patent: Jan. 18, 2005

(54) DIE SUPPORT STRUCTURE

(75) Inventor: Venkateshwaran Vaiyapuri, Singapore (SG)

(73) Assignee: Micron Technology, Inc., Boise, ID (US)

( * ) Notice: Subject to any disclaimer, the term of this patent is extended or adjusted under 35 U.S.C. 154(b) by 138 days.

(21) Appl. No.: 09/972,649

(22) Filed: Oct. 10, 2001

(65) Prior Publication Data

US 2002/0125567 A1 Sep. 12, 2002

Related U.S. Application Data

(62) Division of application No. 09/803,045, filed on Mar. 12, 2001, now Pat. No. 6,469,376.

(30) Foreign Application Priority Data

Mar. 9, 2001 (SG) .......................................... 200101488

(51) Int. Cl.[7] .............................................. H01L 21/44
(52) U.S. Cl. ........................ 438/109; 438/107; 438/108; 438/110
(58) Field of Search ................................ 438/109, 108, 438/107, 110, 618, 666, 112, 124, 127, 617; 257/711, 685–686, 774, 777–778, 784, 723, 684

(56) References Cited

U.S. PATENT DOCUMENTS

| | | | |
|---|---|---|---|
| 5,674,785 A | | 10/1997 | Akram et al. |
| 5,796,165 A | * | 8/1998 | Yoshikawa et al. |
| 5,963,429 A | | 10/1999 | Chen |
| 5,973,403 A | | 10/1999 | Wark |
| 6,013,948 A | * | 1/2000 | Akram et al. |
| 6,091,138 A | | 7/2000 | Yu et al. |
| 6,157,080 A | | 12/2000 | Tamaki et al. |
| 6,262,488 B1 | | 7/2001 | Masayuki et al. |
| 6,265,771 B1 | | 7/2001 | Ference et al. |
| 6,316,727 B1 | | 11/2001 | Liu |
| 6,365,963 B1 | * | 4/2002 | Shimada |
| 6,407,456 B1 | | 6/2002 | Ball |
| 6,469,376 B2 | | 10/2002 | Vaiyapuri |
| 2001/0015485 A1 | | 8/2001 | Song et al. |
| 2002/0074668 A1 | | 6/2002 | Hofstee et al. |
| 2002/0079567 A1 | | 6/2002 | Lo et al. |

FOREIGN PATENT DOCUMENTS

| | | |
|---|---|---|
| EP | 0 729 183 A2 | 8/1996 |
| WO | WO 97/37374 | 10/1997 |

OTHER PUBLICATIONS

"Multi–Chip Module on Laminate, High–performance packaging for today's silicon", *IBM Microelectronics*, 1998.
Copy of Search Report from the Austrian Patent Office dated Aug. 15, 2002.

* cited by examiner

*Primary Examiner*—Long Pham
*Assistant Examiner*—Dilinh Nguyen
(74) *Attorney, Agent, or Firm*—Dickstein Shapiro Morin & Oshinsky LLP

(57) ABSTRACT

Disclosed is a method of forming a support structure for supporting multiple dies and resulting structure. The support structure has a cavity with an upper die support surface, sidewalls providing the upper die support surface, and a lower die support bottom surface connected with the sidewalls. The support structure can be formed of a plurality of layers. A first semiconductor die is secured on the lower die support surface and a second semiconductor die is secured to the upper die support surface. An aperture can be formed from the structure bottom surface to the cavity to facilitate electrical connections between the first die and electrical contact areas on the support structure. An encapsulating material is formed around the dies, the electrical connections, and the vacant cavity space to form a packaged semiconductor device.

25 Claims, 4 Drawing Sheets

US 6,844,217 B2

DIE SUPPORT STRUCTURE

This application is a divisional of application Ser. No. 09/803,045, filed Mar. 12, 2001, the subject matter of which is incorporated by reference herein now U.S. Pat. No. 6,469,376.

BACKGROUND OF THE INVENTION

The invention relates to a method of forming a packaged semiconductor device and the resulting structure.

DESCRIPTION OF RELATED ART

In some types of semiconductor die packaging a die is secured to the surface of a die support structure. Electrical connections are made between the die and the support structure. The die, electrical connections, and at least a part of the support structure are covered with an encapsulating material to form a semiconductor package. Leads extend from the package for electrical connection to any external circuit. The package is generally secured to a printed circuit board or other mounting substrate when in use. One method of reducing the thickness of a conventional semiconductor device package is to use a thin die support structure. A thin support structure is generally about 50 microns to 75 microns thick while a conventional support structure is typically about 200 microns thick. However, a thin support structure is typically about 100% more expensive than a conventional thicker structure and thus increases the cost of packaged semiconductor devices. Another disadvantage of a thin support structure is that during fabrication the thin structure flexes and/or bows more than a thicker structure. This bowing or flexing can weaken the strength of the die's attachment to the structure as well as damage fragile electrical contacts between the die and support structure.

Yet another disadvantage of a thin support structure is its limited ability to secure and support multiple dice on a single support structure. One method of constructing multiple die assemblies on a conventional support structure is to stack dice vertically. U.S. Pat. No. 5,994,166 issued Nov. 30, 1999, to Salman Akram and Jerry M. Brooks discloses a semiconductor package with two die vertically stacked on opposing sides of a substrate. However, if multiple semiconductor dice are vertically stacked on a substrate the height of the packaged semiconductor devices increases. If on the other hand, multiple semiconductor dice are mounted horizontally side by side on a support structure, both the thickness and area of the support structure must be increased to support the multiple dice which results in larger packaged semiconductor devices. Thus, conventional techniques for securing multiple dice to a single support structure increase the dimensions of packaged semiconductor devices. It would be advantageous to have a semiconductor support structure that can secure and support multiple semiconductor dice which will results in a smaller dimensions semiconductor packages than conventional techniques while reducing the cost of the die support structure.

SUMMARY OF THE INVENTION

The invention provides a packaged semiconductor structure in which multiple semiconductor dice are secured to a common support structure. In an exemplary embodiment, a multi-layered support structure is formed. The support structure has a central cavity with an open surface at the top and a die support bottom surface. An aperture with a perimeter smaller than that of the central cavity is formed from the bottom exterior of the support structure to the central cavity. A first semiconductor die is supported and secured to the cavity bottom surface. The first die is electrically connected to the bottom surface of the support structure by electrical connections, e.g., wire bonds, which extend from the die through the aperture to electrical contact areas on the bottom exterior surface of the support structure. A second semiconductor die is secured on the top surface of the support structure and electrical connections are made between the second die and electrical contact areas on the bottom exterior surface of the support structure. The dice, electrical connections and structure cavity are encapsulated with encapsulating material to form a packaged semiconductor assembly.

BRIEF DESCRIPTION OF THE DRAWINGS

These and other advantages and features of the invention will be more readily understood from the following detailed description of the invention which is provided in connection with the accompanying drawings.

DETAILED DESCRIPTION OF EXEMPLARY EMBODIMENTS

The invention will be described as set forth in the exemplary embodiments illustrated in FIGS. 1–7. Other embodiments may be utilized and structural changes may be made without departing from the spirit or scope of the invention.

Figure 1:
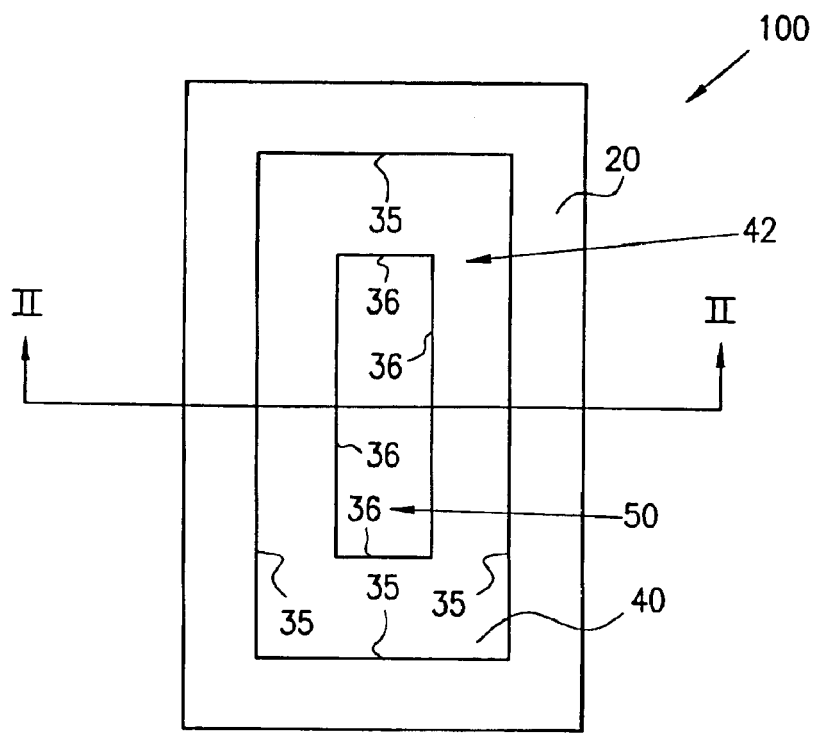
FIG. 1 is a top view of a semiconductor support structure of the invention.
Figure 2:
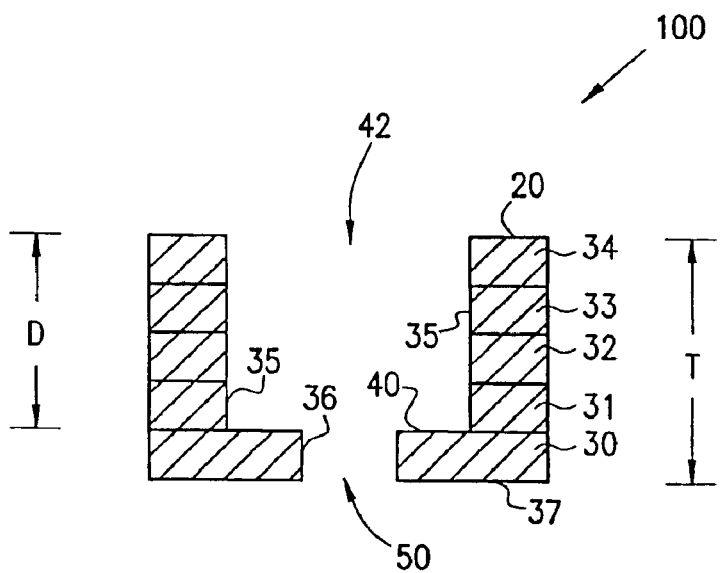
FIG. 2 is a cross-sectional view of FIG. 1.

FIG. 1 illustrates a top view of a semiconductor support structure 100 of the invention. FIG. 2 is an cross-sectional view of FIG. 1 taken at line II—II. The support structure 100 has a top surface 20, exterior perimeter 22, a cavity 42 with interior perimeter 35 and bottom surface 40. An aperture 50 with interior perimeter 36 is provided in bottom surface 40. The interior perimeter 36 of aperture 50 is smaller in size that the interior perimeter of cavity 42 to form bottom surface 40. The support structure 100 is formed of five thin stacked layers 30–34 as shown in FIG. 2. In an exemplary embodiment, the structure 100 is formed of stacked layers of any suitable semiconductor die support material, such as, for example, Bismaleimide Triazine (BT) which may be used for all five layers 30–34.

It is to be understood that the illustration of a five-layer structure 100 is exemplary and that the support structure 100 could be constructed with less than or more than five layers. The support structure 100 is fabricated by securing the five layers 30–34 to each other using techniques well known in the art, for example, with adhesives. The total structure thickness and number of layers is based on the thickness of a die which will be mounted within cavity 42 and the required spacing for various electrical contacts. The support structure 100 can be of any dimension (height, length, or width) suitable for mounting semiconductor dice. An exemplary thickness T for support structure 100 is about 500 microns or less and an exemplary depth D of cavity 42 is 400 microns or less. It is to be understood that each layer as shown in FIG. 2 could be made of a multi-layer laminate as well.

One technique for fabrication of the support structure 100 is described below. Central layer 32 is formed of film of about 200 microns thickness, but larger and smaller thickness are possible. Central layer 32 can also be made of multiple layers, such as a multi-layer laminates. The other layers 30–31, 33–34 thickness can be sized based on the dimensions of the die 60 (FIGS. 3 and 4) and the desired overall package thickness. It is to be understood that the exemplary layers 30–34 can comprise similar or different material and can vary in thickness from each other. Second layer 33 is secured above central layer 32. Fourth layer 31 is secured below central layer 32. First layer 34 is secured above second layer 33. Finally fifth layer 30 is secured to fourth layer 31. It is to be understood that the method of stacking or fabricating the support structure 100 layers 30–34 and/or method of securing the layers 30–34 can vary without limiting the scope of the invention.

One advantage of using a conventional layer thickness of, for example, 200 microns for central layer 32 is that such a conventional layer thickness is commonly available at a lower cost than a thinner material layer. In an exemplary embodiment, the layers 30–34 contain interior electrical paths 90 through the various layers and providing electrical paths 90 for the semiconductor dice 60, 80 (FIG. 7) from the structure's top surface 20 down to the structure's bottom surface 37. It is to be understood that external electrical paths (not shown) located on the surface of layers 30–34 are also possible either adjacent to the cavity's interior perimeter 35 or along the exterior perimeter 22 of the structure 100. Also the die 60 (FIG. 4), while shown as connected by wire bottom to electrical contact areas 76 provided on layer 30, can also connect to the electrical contact areas 76 through conductive vias internal to the layer 30.

An open cavity 42 is formed by layers 30–34 which define a cavity perimeter 35 and a bottom surface 40. The cavity 42 can be any suitable shape. An aperture 50 is shown formed in the fifth layer 30, i.e., which extends from bottom surface 37 to the cavity 42. The aperture 50 has an aperture perimeter 36 which is smaller than the cavity perimeter 35 to provide a mounting surface for die 60. The cavity 42 and aperture 50 can be formed using techniques well known in the art, such as milling. Alternatively preformed layers having holes therein can be stacked to form the support structure 100, having cavity 42 and aperture 50. It is to be understood that the cavity depth D could be varied without limiting the scope of the invention. The cavity depth D is sized based on the thickness of the semiconductor die 60 (FIG. 4) secured inside the cavity 42. An exemplary dimension for cavity depth D is about 250 microns or less. Aperture 50 can be any suitable shape. Aperture 50 is sized to provide a die support surface 40. The dimensions of aperture 50 will vary depending on the dimension of the first semiconductor die 60 and the necessary clearance for proper die 60 operation or for electrical connection. It is to be understood that aperture 50 is optional and is an exemplary way of providing an electrical contact path between the die 60 and structure 100.

Figure 3:
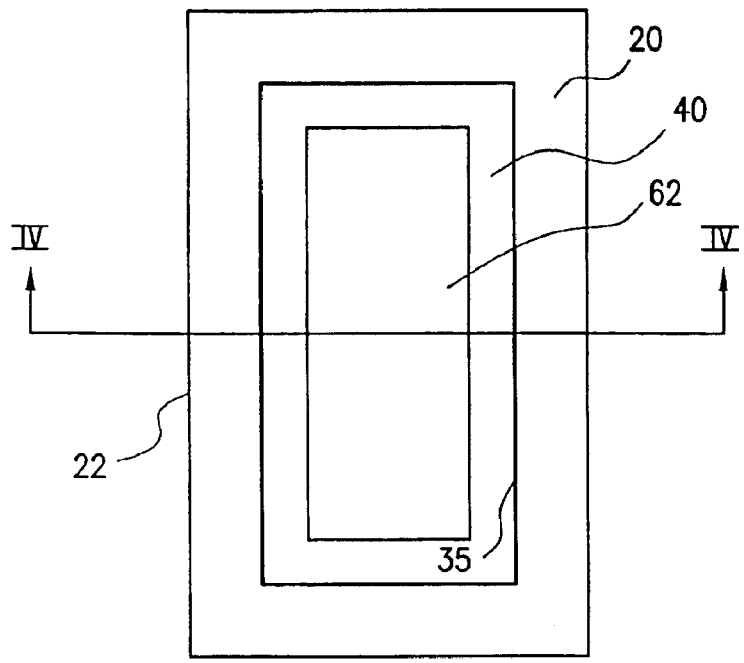
FIG. 3 is a top view of a semiconductor support structure of the invention after a first semiconductor die has been secured inside a cavity of the support structure.
Figure 4:
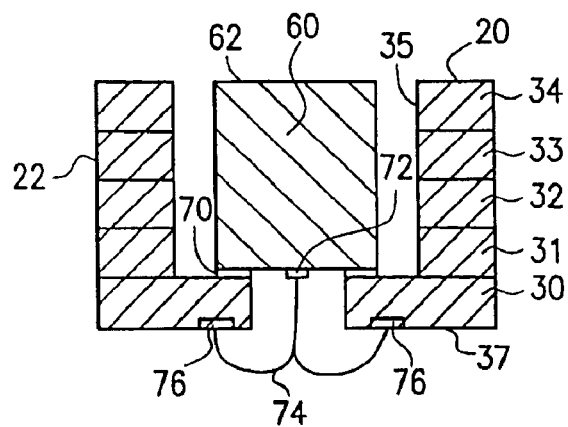
FIG. 4 is an cross-sectional view of FIG. 3.
Figure 5:
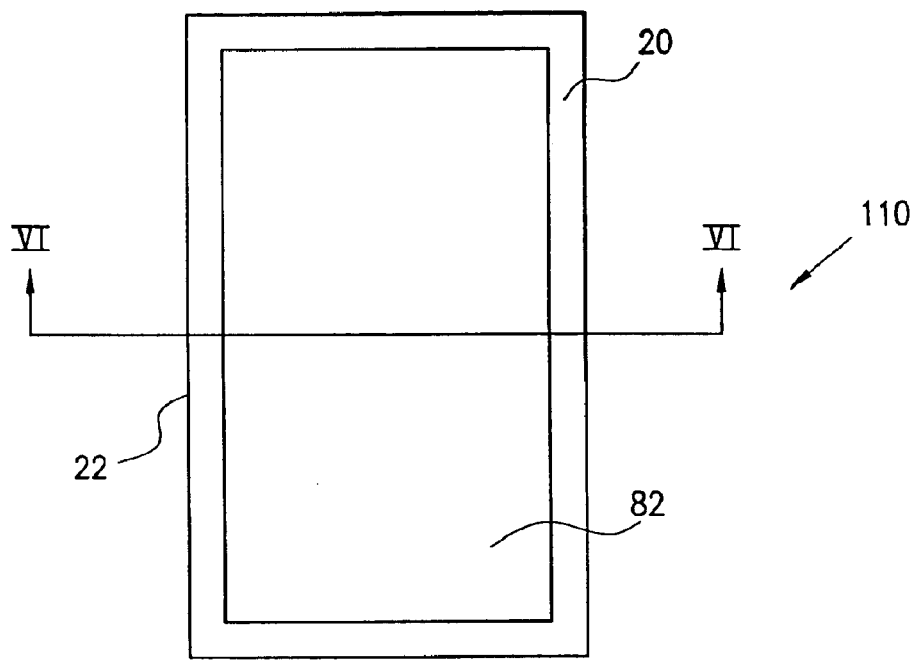
FIG. 5 is a top view of a semiconductor support structure of the invention after a second semiconductor die has been secured to the top of surface of the support structure.
Figure 6:
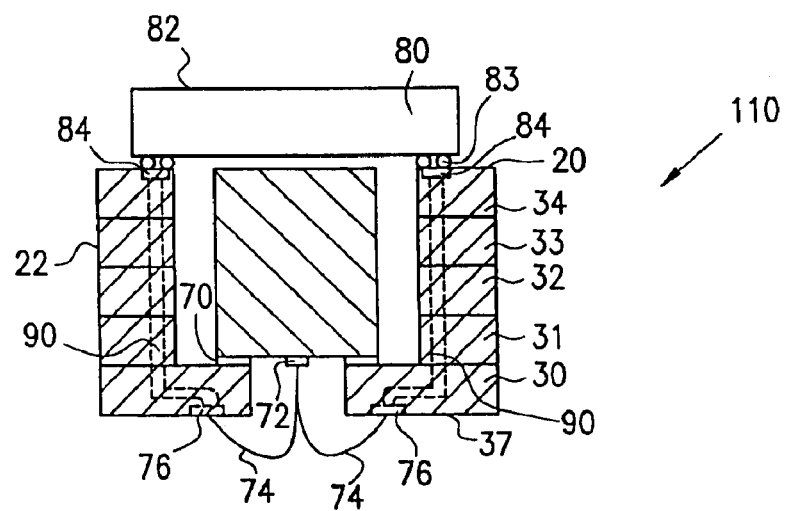
FIG. 6 is a cross-sectional view of FIG. 5.

After support structure 100 is fabricated as shown in FIGS. 1 and 2, a semiconductor die 60, shown in FIGS. 3 and 4, is secured to bottom layer 30, such as, for example, by adhesive layer, bonding tape or solder balls 70, using techniques well known in the art. It is to be understood that more than one semiconductor die 60 can be secured inside the cavity 42, such as two dies 60 stacked on top of each other or side-by-side on the bottom surface 40. In an exemplary embodiment, semiconductor die 60 is a board-on-chip (BOC), where a chip has electrical contact areas formed on the chip surface and the chip is directly bonded to a support surface, such as, a printed circuit. The semiconductor die 60 is electrically connected 74 to electrical contact areas 76, such as, for example, bond pads, on the bottom surface 37 of support structure 100. In an exemplary embodiment, wire bonds 74 extend from the die 60 electrical contact areas 72 through aperture 50 to the support structure electrical contact areas 76. It is to be understood that various materials, types, methods, techniques, and locations for electrical contact areas 72, 76 and electrical connections 74 are possible and that the wire bonds disclosed above and shown in FIG. 4 are only exemplary of one way of electrically connecting die 60 to electrical contact areas 76 provided on the bottom surface 37.

After semiconductor 60 is electrically connected to the support structure 100, a second semiconductor die 80 (FIGS. 5–6) is secured to the top surface 20 of the support structure 100 by connections 83. In an exemplary embodiment the second die 80 is a flip chip, a chip or package where bumps or connecting metal are formed on the chip surface and the chip is flipped over for soldering to a support surface, and is secured by a solder ball connections 83 to electrical contact areas 84 located on the top surface 20 of support structure 100. The second die 80 is arranged to align with various electrical contact areas 84 which are in electrical communication through electrical vias 90 through layers 30–34 to electrical contact areas 76 on the structure bottom surface 37. It is to be understood that the electrical contact areas between die 80 and the structure bottom surface 37 could also be by external conductors on the sidewalls 22, 35 of the support structure 100.

Figure 7:
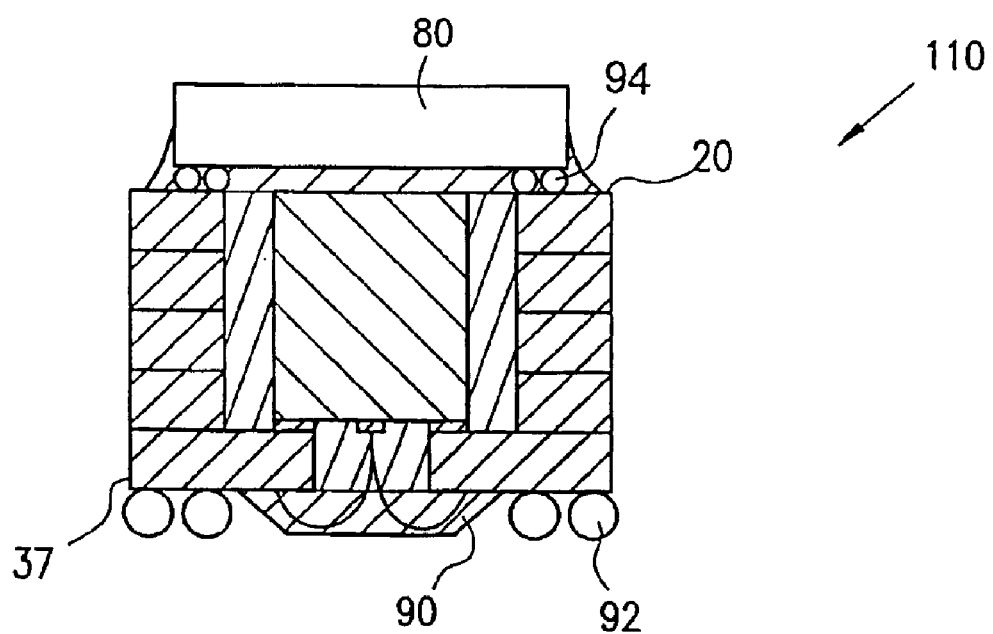
FIG. 7 is a cross-sectional view of a semiconductor support structure of the invention after the semiconductor dice have been encapsulated.

FIG. 7 shows a packaged semiconductor assembly 110 after an encapsulation material 94 has been deposited in cavity 42 and aperture 50 and beneath die 80. The encapsulation material 94 can be any well known material suitable for semiconductor assemblies. The encapsulation material 94 can be selected to provide under fill support for the second semiconductor die 80 as well as to reduce the coefficient of thermal expansion between the dies 60, 80 and structure 100. The encapsulation material 94 is shown covering electrical contacts 74, 83 of the die 60, 80. It is to be further understood that the encapsulation process could be broken into two steps, a first step after the first semiconductor die 60 is secured to the structure 100 and before the second die 80 is secured. And a second step after the second semiconductor die 80 is secured to the structure 100. After the encapsulation material 94 is deposited, additional electrical contact areas 92 can be added to the semiconductor assembly 110, on electrical contact areas 76 such as a fine ball grid array along the bottom surface 37 of the structure 100. It is to be understood that multiple packaged semiconductor assemblies 110 can be formed in a large structure and singulated after fabrication, or at any intermediate stage of fabrication.

Having thus described in detail the exemplary embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of exemplary embodiments

What is claimed as new and desired to be protected by Letters Patent of the United States is:

1. A method of fabricating a die support structure for supporting multiple dice comprising the steps of:
   providing a semiconductor support structure having a top and bottom surface;
   providing a cavity in said support structure, said cavity being defined by an upper diet support surface which has an opening therein, first sidewalls, and a lower die support surface extending inwardly from said first sidewalls, said lower die support surface having an aperture therein which extends to an opening in a bottom surface of said die support structure; and
   coupling a first semiconductor die to said lower die support surface;
   coupling a second semiconductor die to said upper die support surface.

2. The method of claim 1, wherein said support structure comprises a plurality of laminated layers.

3. The method of claim 1, further comprising providing a conductive path in said support structure from said upper die support surface to the bottom surface of said support structure.

4. A method as in claim 3, further comprising:
   forming a first conductive bonding area on said upper die support surface coupled to said conductive path, said first conductive bonding area adapted to electrically couple to said second semiconductor die mounted on said upper die support surface; and
   forming a second conductive bonding area on said bottom surface coupled to said conductive path.

5. A method as in claim 4, further comprising: electrically coupling said first semiconductor die to said second electrically conductive area on said bottom surface.

6. The method of claim 1, further comprising the step of electrically coupling said at least one semiconductor die to said support structure.

7. A method of forming a semiconductor assembly comprising the steps of:
   providing a die support structure having a top and bottom surface;
   providing a cavity in said support structure, said cavity being defined by an upper die support surface which has an opening therein, sidewalls, and a lower die support surface connected with said sidewalls, said lower die support surface having an aperture therein whereby said aperture has a smaller perimeter than said cavity, and said cavity extending from said opening to said lower die support surface;
   securing at least one semiconductor die to said lower die support surface; and
   securing at least another semiconductor die to a top surface of said upper die support surface.

8. The method of claim 7, wherein said at least one semiconductor die is a board-on-chip.

9. A method as in claim 7, further comprising:
   forming a plurality of electrically conductive vias through said die support structure from said upper die support surface to said bottom surface of said die support structure;
   electrically coupling said another semiconductor die to an exposed portion of said electrically conductive vias on said upper die support surface; and
   forming a plurality of separate electrical couplings between said semiconductor die coupled to said lower support structure to exposed portions of said plurality of electrically conductive vias on said bottom surface of said die support structure.

10. A method of forming a semiconductor assembly comprising the steps of:
    providing a die support structure having a top and bottom surface;
    providing a cavity in said support structure, said cavity being defined by an upper die support surface which has an opening therein, sidewalls which provide said upper die support surface, and a lower die support surface, said cavity extending from said opening to said lower die support surface;
    providing an aperture in said lower die support surface, said aperture extending from the support structure bottom surface to said cavity, said aperture having a smaller area than an area of said cavity;
    forming at least one conductive area on said support structure bottom surface adapted to be electrically coupled through said aperture to at least one conductive area of a die mounted within said cavity;
    securing at least one semiconductor die to said upper die support surface; and
    securing at least another semiconductor die to a top surface of said lower die support surface.

11. The method of claim 10, wherein said at least one semiconductor die secured to said upper die support surface is a flip chip.

12. The method of claim 10, further comprising the steps of at least partially encapsulating said support structure with encapsulation material.

13. A method as in claim 10, further comprising:
    forming a plurality of electrically conductive paths from said upper die support structure to said bottom surface of said die support surface.

14. A method as an claim 13, further comprising forming an electrically conductive bonding wire between an exposed portion of at least one of said electrically conductive paths on said bottom surface of said die support surface to said die mounted within said cavity.

15. A method of fabricating a die support structure for supporting multiple dice comprising the steps of:
    forming a semiconductor support structure having a top and bottom external surface;
    providing a cavity in said semiconductor support structure, said cavity being defined by:
    an upper die support surface on said top external surface which has an opening therein;
    first sidewalls extending to a lower die support surface within said cavity, said lower die support surface extending substantially laterally from said first sidewalls, said lower die support surface further defined by an aperture therein;
    second sidewalls extending from said lower die support surface surrounding said aperture to said support structure bottom external surface, said aperture having a smaller area than that of a portion of said cavity defined by said first sidewalls above said lower die support surface;
    wherein said aperture is adapted to allow the routing at least one electrical path through said aperture from a die mounted on said lower die support surface to at least one conductive area located on said support structure bottom external surface; and mounting a first semiconductor die on said lower die support surface;

mounting a second semiconductor die on said upper die support surface.

16. A method as in claim 15, further comprising forming said semiconductor support structure with a plurality of laminated layers which are adhered together to form said semiconductor support structure.

17. A method as in claim 15, further comprising:

forming at least one conductive area on said support structure external bottom surface adapted to be electrically coupled with a die coupled to said lower die support surface through said aperture.

18. A method as in claim 17, wherein said conductive path is internal to said sidewalls.

19. A method as in claim 17, wherein said conductive path is formed on at least one surface of said sidewalls.

20. A method as in claim 17, further comprising forming at least one electrical contact area on said upper die support surface.

21. A method as in claim 20, further comprising forming at least one electrical path from said die mounted on said lower die support surface to said at least one conductive area on said support structure external bottom surface through one of said at least one aperture.

22. A method as in claim 21, further comprising filling said cavity with an encapsulation material.

23. A method as in claim 20, further comprising:

forming a conductive path from said electrical contact area on said upper die support surface through said semiconductor support structure to one of said at least one conductive area located on said support structure bottom external surface.

24. A method as in claim 23, further comprising:

electrically coupling said first semiconductor die to said at least one conductive area located on said support structure bottom external surface.

25. A method as in claim 21, further comprising forming encapsulation material around said at least one electrical path.

* * * * *